United States Patent
Tsuda et al.

(10) Patent No.: US 7,304,478 B2
(45) Date of Patent: Dec. 4, 2007

(54) MAGNETIC RESONANCE IMAGING APPARATUS PROVIDED WITH MEANS FOR PREVENTING CLOSED LOOP CIRCUIT FORMATION ACROSS AND BETWEEN INSIDE AND OUTSIDE OF CRYOSTAT

(75) Inventors: Munetaka Tsuda, Mito (JP); Hiroyuki Takeuchi, Kashiwa (JP); Isao Sakamoto, Kashiwa (JP)

(73) Assignee: Hitachi Medical Corporation, Tokyo (JP)

( * ) Notice: Subject to any disclaimer, the term of this patent is extended or adjusted under 35 U.S.C. 154(b) by 78 days.

(21) Appl. No.: 10/528,759

(22) PCT Filed: Sep. 12, 2003

(86) PCT No.: PCT/JP03/11678

§ 371 (c)(1),
(2), (4) Date: Mar. 22, 2005

(87) PCT Pub. No.: WO2004/037081

PCT Pub. Date: May 6, 2004

(65) Prior Publication Data
US 2005/0248350 A1    Nov. 10, 2005

(30) Foreign Application Priority Data
Oct. 24, 2002  (JP)  .............................. 2002-309954

(51) Int. Cl.
*G01V 3/00* (2006.01)

(52) U.S. Cl. .................................................. 324/322

(58) Field of Classification Search ........ 324/300–322; 600/407–435
See application file for complete search history.

(56) References Cited

U.S. PATENT DOCUMENTS

| 5,635,888 | A | 6/1997 | Good | |
| 6,748,749 | B2 * | 6/2004 | Tsuda | .......................... 62/49.2 |

FOREIGN PATENT DOCUMENTS

| JP | 63-88810 | 4/1988 |
| JP | 63-278310 | 11/1988 |
| JP | 1-117004 | 5/1989 |
| JP | 1-126956 | 5/1989 |
| JP | 8-504107 | 5/1996 |
| JP | 9-224919 | 9/1997 |
| JP | 11-16718 | 1/1999 |
| JP | 2002-143126 | 5/2002 |
| JP | 2002-209869 | 7/2002 |

* cited by examiner

*Primary Examiner*—Brij Shrivastav
*Assistant Examiner*—Dixomara Vargas
(74) *Attorney, Agent, or Firm*—Cooper & Dunham LLP

(57) ABSTRACT

A MRI apparatus includes a super-conducting magnet including a superconducting coil circuit having a superconducting coil and a permanent current switch for controlling permanent current flowing through the super-conducting coil; at least one electrical circuit which is electrically connected to at least one electrical element and disposed at the outside of the super-conducting magnet; a gradient magnetic filed generating means; a high frequency magnetic field generating means; and shielded examination room which accommodates the super-conducting magnet. The apparatus further comprises means for interrupting noise current generated based on tomographic image measurement of the subject. Said means is disposed outside the super-conducting magnet and inside the shielded examination room while being inserted between the electrical circuit and the super-conducting magnet.

36 Claims, 9 Drawing Sheets

MAGNETIC RESONANCE IMAGING APPARATUS PROVIDED WITH MEANS FOR PREVENTING CLOSED LOOP CIRCUIT FORMATION ACROSS AND BETWEEN INSIDE AND OUTSIDE OF CRYOSTAT

FIELD OF THE INVENTION

The present invention relates to a super-conducting magnet device using super-conducting coils and a magnetic resonance imaging (herein below called as MRI) apparatus using the same and, in particular, relates to a super-conducting magnet device having an improved operating stability and an open type MRI apparatus using the same.

CONVENTIONAL ART

In majority of conventional MRI apparatuses, although a long and narrow cylindrical solenoid coil has been used as a magnet device used for generating static magnetic field, recently, open type MRI apparatuses in which an examination space for laying a patient is opened are being developed. An open type MRI apparatus has a structure in which magnets for generating static magnetic field are disposed in upper and lower sides of the examination space so as to permit an interventional maneuver, i.e. to perform an operation or endoscopy examination while effecting an MRI examination. Although, open type MRIs in the early stage are for low and intermediate magnetic field use and employ a permanent magnet as a magnet, however, recently, super-conducting magnets are being introduced to the open type MRIs for high quality imaging and high level functioning.

In order to realize a high quality imaging and high level functioning of the MRI apparatuses, not only a simple use of a magnet for generating magnetic field of high intensity as the magnet used for generating static magnetic field but also a high speed imaging method, a gradient magnetic field generating means which operates in high performance and high speed, a high frequency magnetic field generating means which excites in a short time nuclear spins in an examination portion of a subject and a high frequency coil (RF coil) which detects in high sensitivity nuclear magnetic resonance signals (NMR signals) are necessary components. Accordingly, in the open type MRI apparatuses using a super-conducting magnet, such as the high performance gradient magnetic field coil, the high frequency coil and the like are being implemented.

Now, in a magnet device using a super-conducting magnet, a super-conducting coil for generating magnetic field is generally disposed in a cryostat filled with liquid helium, the super-conducting coil kept under a critical temperature by the liquid helium is excited and after being reached to a predetermined permanent current value, a permanent current is caused to flow through the super-conducting coil by turning on a permanent current switch (PCS). In an MRI apparatus using such super-conducting coil, if the state of the permanent current is once broken such as because of a temperature change in an environment where the super-conducting coil is placed, not only the imaging operation is totally disabled but also it takes a lot of time and work for the restoring thereof. On the other hand, there can be sometimes a situation where the intensity of the static magnetic field has to be reduced even during an imaging operation due to unexpected circumstance such as sudden condition change of a patient. For these reasons, the MRI apparatuses using the super-conducting coil provided with such as a monitor circuit which monitors an amount of liquid helium in the cryostat and an emergency demagnetization unit which stops operation of the magnet device by rising the temperature of the super-conducting coil above the critical temperature and demagnetizing the static magnetic field at the time of emergency are being developed.

In the above explained MRI apparatuses using the super-conducting magnet, when it is intended to employ an open type for the super-conducting magnet as well as to realize the above referred to high level functioning and high quality imaging, it was found out that the following problems will arise. Namely, such as the unit which generates in a short time an intense high frequency magnetic field and the unit which switches in a high speed as well as generates a high intensity gradient magnetic field necessarily require power sources having an increased capacity for driving the same which induce noises due to electro-magnetic interference in the MRI apparatus itself and electrical circuits around the same. Further, in the open type MRI apparatus, since both RF coil for generating the high frequency magnetic field and gradient magnetic field coil for generating the gradient magnetic field are flat plate shapes, the leakage magnetic field from the coils are intense in comparison with that from conventional ones having cylindrical shapes, therefore, the intense leakage magnetic field also causes to induce noises due to electro-magnetic interference in the MRI apparatus itself and the electrical circuits around the same like the same reason caused by the increased power source capacity as explained above.

Accordingly, an object of the present invention is to provide a super-conducting magnet and an MRI apparatus using the same which excludes an influence to a super-conducting coil circuit due to magnetic flux variation by the gradient magnetic field and the high frequency magnetic field caused in association with the imaging operation of the MRI apparatus and permits a reliable and stable operation of the super-conducting magnet.

SUMMARY OF THE INVENTION

In order to achieve the above object, the present inventors have studied in detail surrounding electrical circuits, which possibly affect to the super-conducting coil in the MRI apparatus. As a result, the inventors have discovered that a closed loop circuit is formed between an external control circuit or an external monitor circuit to which such as sensor elements for measuring in-vessel environment, in particular, helium liquid level and emergency demagnetization use heater elements both disposed in a vessel accommodating the super-conducting coil and the super-conducting coil circuit through electro-magnetic coupling which can not be expected in conventional magnet devices, in particular, the electromagnetic coupling is large in such a magnet device in which a pair of super-conducting magnets are disposed while sandwiching a measurement space between the magnets and are connected via a coupling tube, and when varying magnetic fluxes due the gradient magnetic field and the high frequency magnetic field generated in association with the imaging operation in the MRI apparatus pass through the closed loop circuit, an induced current flows in the closed lop circuit, thereby, such as the control circuit and the monitor circuit may erroneously operate as well as the super-conducting state of the super-conducting coil circuit may be broken. The present invention is realized based on the above discovery.

Namely, a super-conducting magnet device according to the present invention including a super-conducting coil circuit having a super-conducting coil and a permanent current switch for controlling a permanent current flowing through the super-conducting coil and a vessel accommodating the super-conducting coil at a temperature for maintaining the same in super-conducting state is characterized, in that the super-conducting magnet device is further provided with means for electro-magnetically shielding the super-conducting coil with respect to the outside of the vessel.

Further, a super-conducting magnet device according to the present invention including a super-conducting coil circuit having a super-conducting coil and a permanent current switch for controlling a permanent current flowing through the super-conducting coil and a vessel accommodating the super-conducting coil at a temperature for maintaining the same in super-conducting state is characterized, in that the vessel is provided with a terminal portion for connecting a heater element or a sensor element disposed in the vessel to an external circuit and the terminal portion is provided with means for forming a closed loop circuit including the external circuit, an outer wall of the vessel and a grounding point provided at the wall.

An MRI apparatus according to the present invention includes as a static magnetic field generating device the above explained super-conducting magnet device and, for example, includes a super-conducting coil circuit having a super-conducting coil and a permanent current switch for controlling a permanent current flowing through the super-conducting coil, a super-conducting magnet formed with a helium vessel in which a heater element for controlling demagnetization of the super-conducting coil or a sensor element for measuring amount of liquid helium are accommodated, a control circuit or a monitor circuit which is electrically connected to the elements and disposed at the outside of the helium vessel, a gradient magnetic field generating means for generating a gradient magnetic field and providing the same to a static magnetic field generated by the super-conducting magnet and a high frequency magnetic field generating means for generating a high frequency magnetic field to be applied to a subject and is characterized in that the MRI apparatus is further provided with means for interrupting formation of a closed loop circuit across the control circuit or the monitor circuit and the super-conducting coil circuit.

In the MRI apparatus according to the present invention, as the interrupting means, for example, a filter circuit unit or a switch circuit can be employed and such interrupting means is connected between the elements and the control circuit or the monitor circuit. The filter circuit unit can be formed, for example, by including an outer casing and a filter element accommodated in the outer casing, and in this instance, a conductor connected to the outer casing forms another closed loop circuit together with the control circuit or the monitor circuit so as to bypass the first closed loop circuit.

In the super-conducting magnet device and the MRI apparatus according to the present invention, since the closed loop circuit produced by coupling such as the control circuit and the monitor circuit with the super-conducting coil circuit can be substantially interrupted, for example, even if an electromagnetic interference due to the operation such as of the gradient magnetic coil and the high frequency magnetic field coil in the MRI apparatus is caused, an induced current thereby never flows in the super-conducting coil circuit and a stable operation of the super-conducting coil circuit can be reliably obtained.

In the MRI apparatus, the interrupting means is preferably a filter circuit, which at least cuts off signals having driving frequencies of the gradient magnetic field generating means and frequency band of the high frequency magnetic field.

The present invention is preferably applied to an MRI apparatus in which a pair of super-conducting coils in the super-conducting magnet are disposed while sandwiching a measurement space where a subject is laid. Further, the present invention is preferably applied to an MRI apparatus in which the gradient magnetic field generating means and the high frequency magnetic field generating means are respectively flat plate shape coils which are respectively disposed in a manner to sandwich the measurement space where the subject is laid. With such MRI apparatus, in particular, a desirable advantage can be obtained.

DETAILED DESCRIPTION OF THE EMBODIMENT

Herein below, embodiments of the present invention will be explained with reference to the drawings.

Figure 1:
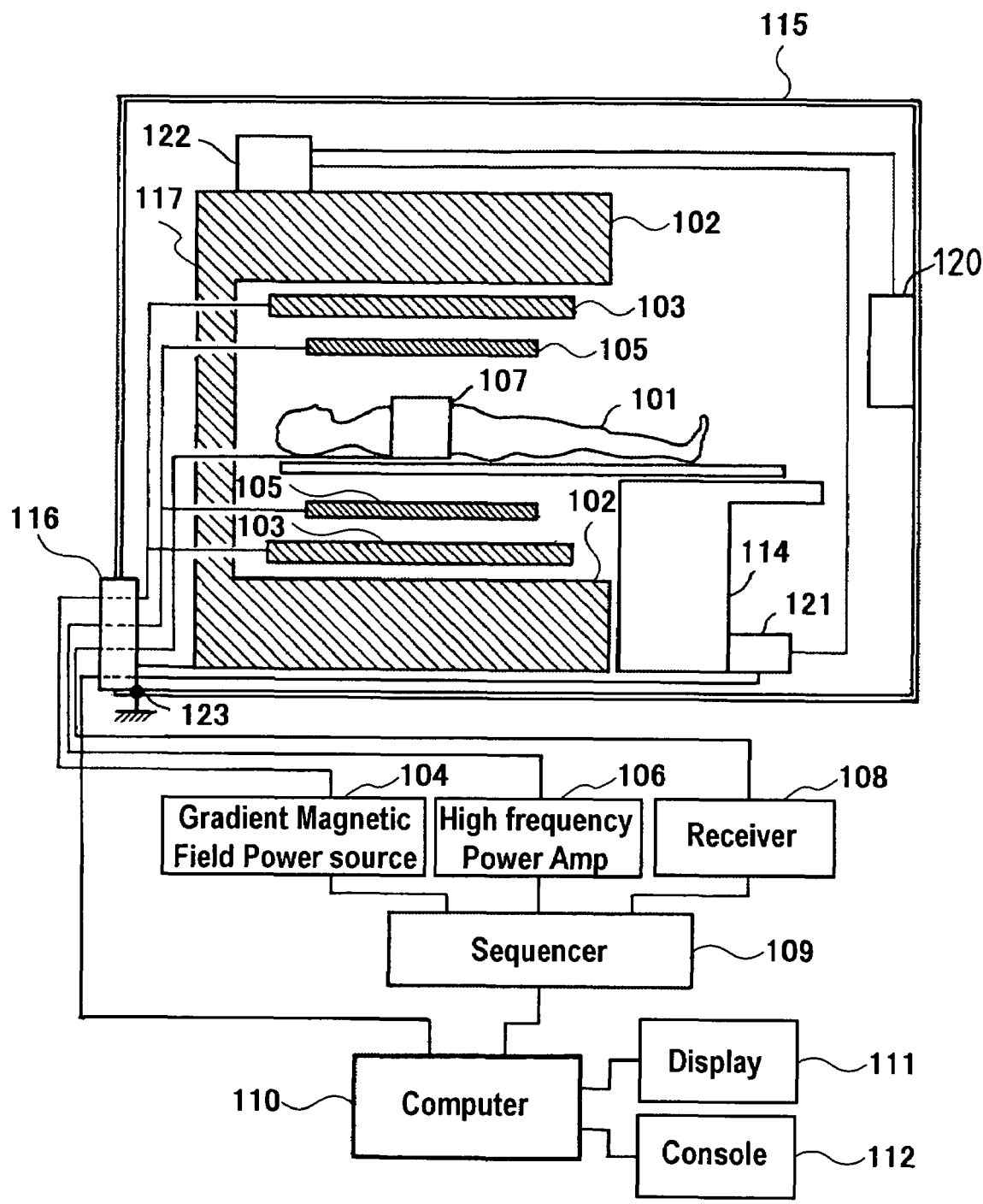
FIG. 1 is a view showing an embodiment of open type MRI apparatus using a super-conducting magnet device according to the present invention.

FIG. 1 is an entire structural diagram of an embodiment of open type MRI apparatus using a super-conducting magnet device according to the present invention. The MRI apparatus is provided with a pair of static magnetic field generating magnets 102 disposed so as to sandwich an examination space where a subject is laid, gradient magnetic field coils 103 respectively disposed at the sides of the examination space of the static magnetic field generating magnets 102, high frequency coils 105 disposed further inner sides thereof, a detection coil 107 for detecting NMR signals generated from the subject 101 and a carrier table 114 for laying the subject 101 in a center space of the static magnetic field generating magnets 102. These gradient magnetic field coils 103 and high frequency coils 105 are formed respectively in a flat plate shaped structure of vertical pairs so as not to disturb the advantages of an open type magnets. Further, in the drawing, although the high frequency coils 105 and the detection coil 107 are shown as separate coils, only the high frequency coils can be served as both functions of high frequency irradiation use and detection use.

The static magnetic field generating magnets 102, the gradient magnetic field coils 103, the high frequency coils 105, the detection coil 107 and the carrier table 114 are disposed in an electro-magnetic wave shielded examination room 115. The electro-magnetic wave shield is for preventing electro-magnetic waves coming from externally to the detection coil 107 and has, for example, an attenuation factor of about 70 dB with respect to a resonance frequency band of atomic nuclei used for the inspection (42 MHz for hydrogen nuclei usually used).

At the outside of the shielded examination room 115, a gradient magnetic field power source 104 for driving the gradient magnetic field coils 103, a high frequency power amplifier 106 for driving the high frequency coils 105, a signal receiver 108 for receiving signals detected by the detection coil 107, a sequencer 109 for controlling operation timing of the respective coils and a computer 110 which controls the entire apparatus and images the NMR signals after processing the same are located.

These power sources and the control units disposed at the outside the shield examination room 115 and such as the variety of coils, the static magnetic field generating magnets 102 and the carrier table 114 disposed inside the shield examination room 115 are connected either via a filter circuit 116 which is grounded together with the shielded examination room 115 or via a coaxial cable of which outer portion is covered with a shield layer (in the drawing, the connection is illustrated without discriminating the filter circuit and the coaxial cable). Thereby, ingress of external noises into the shielded examination room 115 is prevented.

In the illustrated embodiment, the static magnetic field generating magnets 102 are constituted by a pair of cryostats 117 formed by dividing vertically, super-conducting coils assembled insides the respective cryostats 117 and an iron yoke (not illustrated) forming a magnetic circuit for the magnetic fluxes generated by the super-conducting coils The super-conducting coils generate static magnetic field of homogeneous intensity in the space where the subject 101 is laid. The intensity of the magnetic field is, for example, 1.0 tesla, the magnetic fluxes are directed from the floor to the ceiling and the homogeneity of the magnetic field is adjusted to be less than about 5 ppm in a spherical space of 40 cm diameter where the subject 101 is laid. Such magnetic field homogeneity adjustment is performed through either passive shimming or active shimming, and the passive shimming is performed, for example, by adhering a plurality of small pieces of magnetic bodies (not illustrated in the drawing) on the surfaces of the pair of cryostats 117.

Although not illustrated in FIG. 1, the static magnetic field generating magnets 102 is further provided with internal circuit elements such as a connection circuit with an excitation use power source and a permanent current switch (PCS) for controlling permanent current as well as to which is connected units for controlling the operation, namely, an emergency demagnetizing unit 120 for quickly attenuating the magnetic field generated by the static magnetic field generating magnets 102 at the time of emergency and a measurement unit 121 for monitoring helium liquid level in the pair of cryostats 117. The measurement unit 121 is connected to the computer 110 via the filter circuit 116 and sends out measured data as electrical signals. In the illustrated example, the emergency demagnetizing unit 120 is attached on the wall of the shielded examination room 115 and the measurement unit 121 is attached at the backside of the carrier table 114. Signal cables for these emergency demagnetizing unit 120 and the measurement unit 121 are connected such as to a heater element and a liquid level measurement use sensor element disposed inside the cryostats 117 via a filter circuit 122 according to an embodiment of the present invention.

The gradient magnetic field coils 103 are formed by a set of three coils each wound so as to vary the magnetic flux density in three axial directions of x, y and z which perpendicularly cross each other, respectively connected to the gradient magnetic field power source 104 and constitute the gradient magnetic field generating means. By varying the current flowing through the gradient magnetic field coils 103 through driving the gradient magnetic field power source 104 according to control signals from the sequencer 109, gradient magnetic fields Gx, Gy and Gz in three axes are superposed on the static magnetic field in the space where the subject 101 is laid. The gradient magnetic fields are used for discriminating spatial distribution of the NMR signals obtained from the examination portion of the subject 101.

The high frequency coils 105 are connected to the high frequency power amplifier 106 for flowing high frequency current thereto and generates, for example, high frequency magnetic field of 42 MHz for causing resonance excitation in hydrogen nuclei in the examination portion of the subject 101. The high frequency power amplifier 106 is also controlled by control signals from the sequencer 109.

The detection coil 107 is connected to the signal receiver 108 and constitutes means for detecting NMR signals. The signal receiver 108 amplifies and detects the NMR signals detected by the detection coil 107 as well as converts the same into digital signals, which are processable in the computer 110. The signal receiver 108 is also controlled by the sequencer 109 of its operation timing.

The computer 110 performs arithmetic processing such as image reconstruction and spectrum calculation by making use of the NMR signals converted into digital amount as well as controls at a predetermined timing the operation of the respective units in the MRI apparatus via the sequencer 109. An arithmetic processing system is constituted by the computer 110, a display device 111 for displaying data after being processed and a console 112 for inputting operational information.

Figure 2:
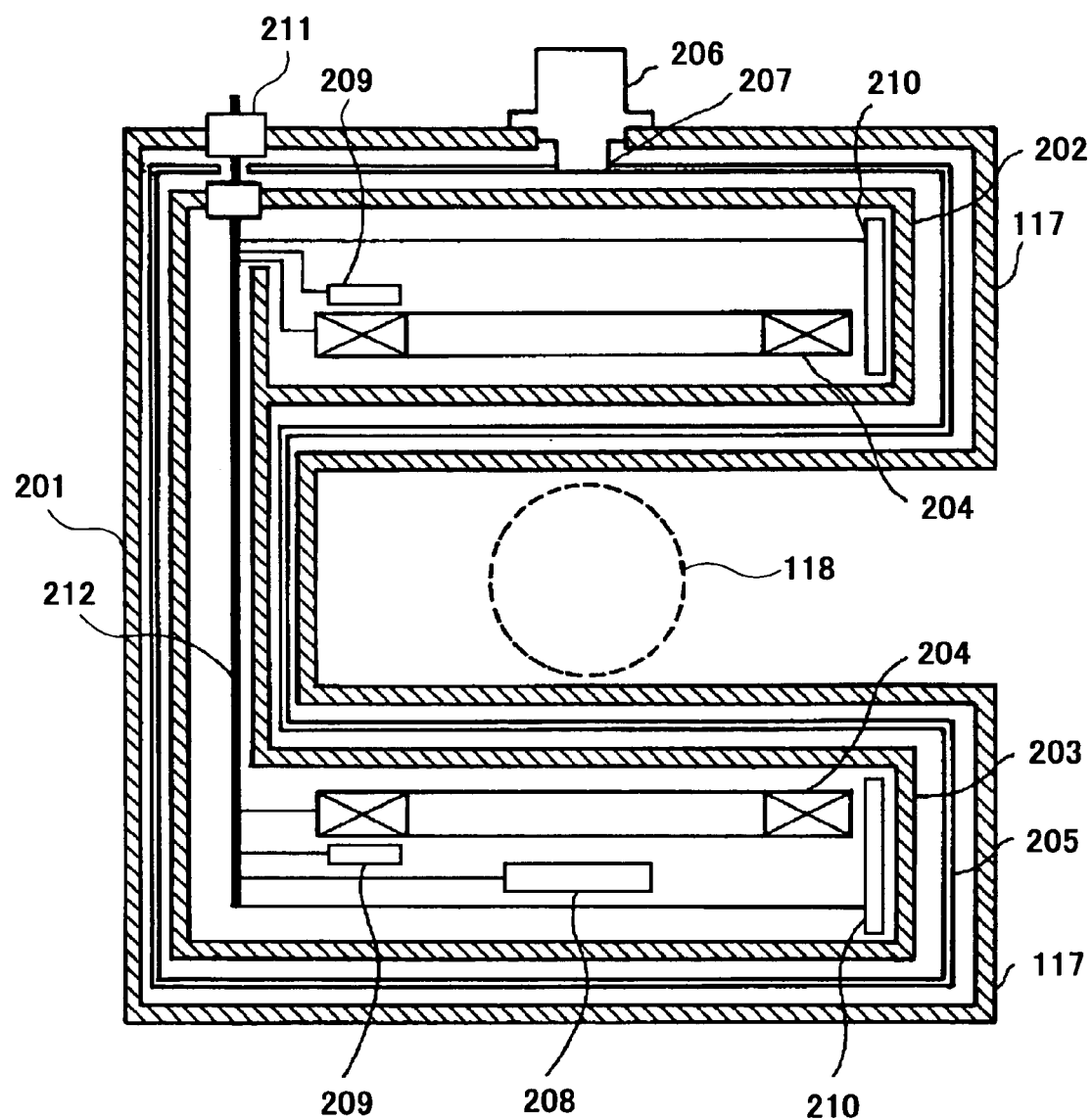
FIG. 2 is a view showing in detail of a magnetic field generating device being employed in the MRI apparatus as shown in FIG. 1.

The static magnetic field generating magnets 102 serving as the static magnetic field generating device will be explained in further detail. As illustrated in FIG. 2, inside the static magnetic field generating magnets 102, the pair of cryostats 117 are connected by a coupling tube 201 and disposed vertically while sandwiching the space 118 where the subject is laid. The inside of the pair of cryostats 117 is kept in high vacuum and in which an upper helium vessel 202 and lower helium vessel 203 both filled with liquid helium are assembled. Each one of the pair of super-conducting coils 204 is accommodated in the upper helium vessel 202 and the lower helium vessel 203, and under a condition that the super-conducting coils 204 are maintained in a low temperature of 4.2 Kelvin by the liquid helium, permanent current, for example, of 400 ampere is flown in the super-conducting coils 204 and magnetic field having intensity of 1.0 tesla is generated in the space 118. In FIG. 2, although a pair of super-conducting coils 204 are illustrated, a plurality of pairs of super-conducting coils having different size and different number of turns can be accommodated so as to set such magnetic field intensity, magnetic field homogeneity and leakage magnetic field intensity at predetermined values.

Between the cryostats 117 and the upper helium vessel 202 and the lower helium vessel 203, a heat shield 205 surrounding the helium vessels is provided. In the drawing, the heat shield 205 having only one layer is illustrated, however, heat shield 205 having more than one layer can be used, and, for example, the layer is constituted by an aluminum plate of 1 mm thick. The heat shield 205 is thermally connected to a helium refrigerator 206 at a contacting point 207 and is kept at a low temperature of, for example, 20 Kelvin. By covering the upper helium vessel 202 and the lower helium vessel 203 with such low temperature heat shield 205, direct radiant heat from the room temperature (300 Kelvin) is prevented, thereby evaporation of liquid helium can be minimized. The upper helium vessel 202, the lower helium vessel 203, the heat shield 205 and the pair of cryostats 117 are connected at a portion of the coupling tube 201 so as to uniformalize the temperature in the upper and lower helium vessels.

In the upper helium vessel 202 and the lower helium vessel 203, other than the super-conducting coils 204 such as a permanent current switch (PCS) 208, an emergency demagnetization use heater element 209, sensor elements 210 for measuring level of liquid helium and a protection element (not illustrated) for the super-conducting coils are assembled. The heater element 209 and the sensor elements 210 are connected via a connector 211 to control circuits (the emergency demagnetizing unit 120, the measurement unit 121) disposed outside the super-conducting coils 102. Lead wires 212 for connecting the respective elements and the pair of super-conducting coils in the upper helium vessel 202 and the lower helium vessel 203 are assembled in the coupling tube 201 after being bundled and gathered together.

Figure 3:
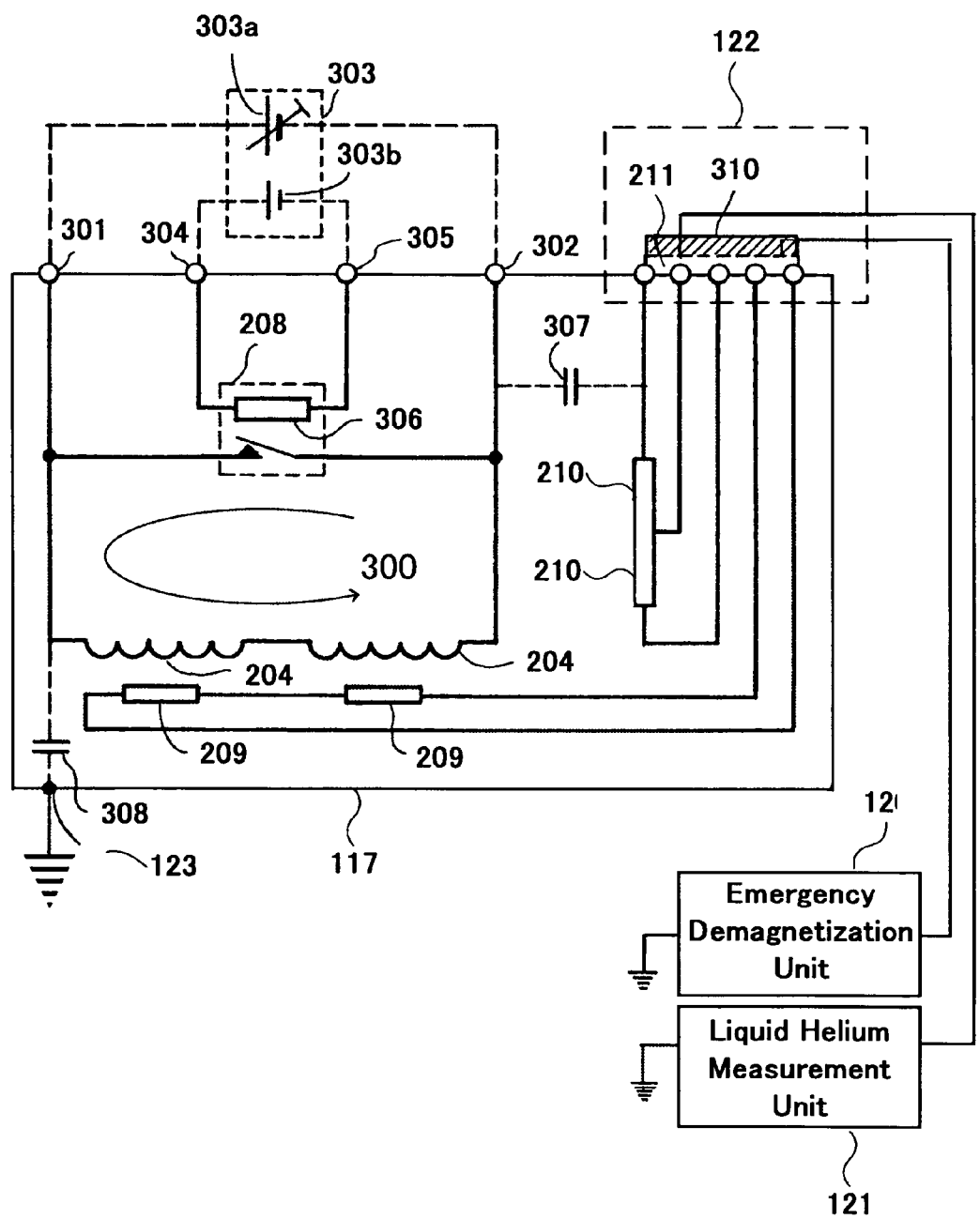
FIG. 3 is a view showing an equivalent circuit of the magnetic field generating device as shown in FIG. 2.

An equivalent circuit of the super-conducting circuit and the external control circuits in such static magnetic field generating magnets 102 is shown in FIG. 3.

The super-conducting circuit is constituted by the pair of super-conducting coils 204 connected in series and the permanent current switch (PCS) 208 connected in parallel with the both ends thereof, and a power source portion 303 therefor is constituted by an excitation power source 303a for exciting the super-conducting coils and a heater power source 303b used for a heater 306 built-in in the PCS 208.

The super-conducting coils 204 and the PCS 208 are disposed inside the cryostats 117 and are connected to the excitation power source 303a and the heater power source 303b both disposed outside via respective terminals 301, 302, 304 and 305. The cryostats 117 are connected to a grounding point 123, which is system ground, of the filter box and kept at the ground potential.

Further, although not illustrated in the drawing, to an internal circuit including the super-conducting coil circuit, such as a protection diode for performing protection and checking of the super-conducting coils 204 and lead wires for measuring potentials and resistances at respective points in the closed loop are connected. These lead wires and super-conducting wires for connecting the super-conducting coils 204 and the PCS 208 to the respective terminals are bundled and passed in the coupling tube 201.

When exciting the super-conducting coils 204, the heater power source 303b is connected to the terminals 304 and 305 of the PCS 208 and while keeping the PCS 208 under normal conducting state (high resistance state) through heat generation of the built-in heater 306, the output of the excitation power source 303a is gradually increased. At the time when the current flowing through the super-conducting coils 204 reaches a predetermined value, the power source 303b for the built-in heater 306 is cut off and a closed loop (as indicated by arrow 300) of the PCS 208 and the super-conducting coils 204 is formed to thereby cause to flow permanent current under super-conducting state through the closed loop 300.

Other than such driving circuit for the super-conducting coils, as a control circuit and monitor circuit (herein below sometimes abbreviated as control and monitor circuit) for maintaining and managing the operation of the static magnetic field generating magnets 102, the heater element 209 for attenuating the magnetic field at the time of emergency and the sensor elements 201 for measuring the amount of liquid helium in the upper and lower helium vessels 202 and 203 are provided in the cryostats 117. The heater element 209 is constituted by a resistance element, which generates heat when a voltage from the emergency demagnetizing unit 120 is applied thereto and is connected to the emergency demagnetizing unit 120 via the terminal 211. The sensor elements 210 are constituted by a super-conducting material of which resistance value varies depending on the temperature and are disposed respectively in the upper and lower helium vessels, the upper and lower sensor elements are electrically connected and the respective ends of both sensor elements and the intermediate point thereof are connected via the terminal 211 to the liquid helium measurement unit 121. Lead wires connecting the heater element 209 and the sensor elements 210 with the terminal 211 are likely bundled and passed through the coupling tube 201.

Figure 4:
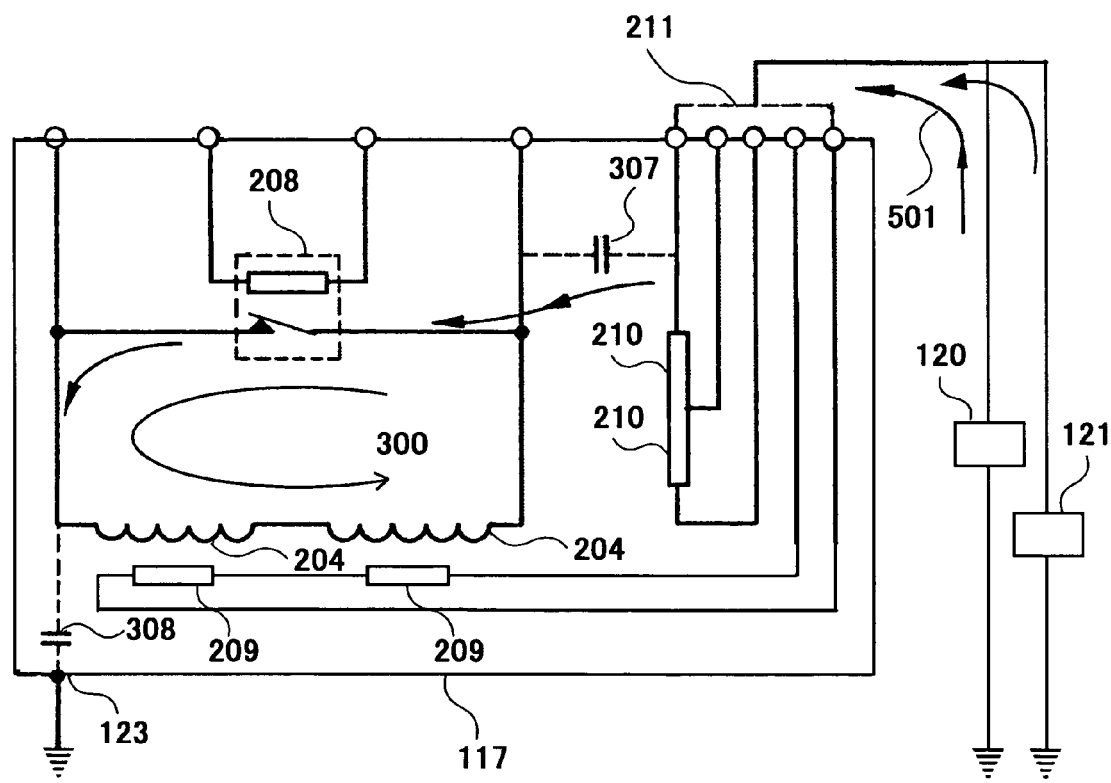
FIG. 4 is a view for explaining a closed loop, circuit formed between inner circuits including a super-conducting coil and outer circuits in an open type MRI apparatus using a conventional super-conducting magnet device.

As has been explained above, since the lead wires constituting the super-conducting coil circuit and the lead wires constituting the control and monitor circuit (emergency demagnetizing unit 120, liquid helium measurement unit 121) are passed through the narrow coupling tube 201 coupling the upper and lower cryostats 117, the lead wires couple strongly each other. The couplings are shown as stray capacitances 307 and 308 in FIG. 3. Although the values of these capacitances are largely affected by such as the shape of the magnets and bundling and arranging method of the lead wires, in the instance of the present embodiment apparatus, as a typical example, it was observed that the stray capacitance 307 between the super-conducting coil circuit and the control and monitor circuit is about 0.7 nF and the stray capacitance 308 between the super-conducting coil circuit and the cryostats 117 is about 6 nF. As a result of such coupling, a closed loop circuit 501 passing through the control and monitor circuit 120,121, the terminal 211, the lead wires, the stray capacitance 307, the super-conducting coil circuit, the stray capacitance 308 and the grounding point 123 of the cryostats 117 is formed as shown in FIG. 4.

In the MRI apparatus of the present embodiment, in order to prevent the current flow-in into the super-conducting coil circuit through the stray capacitances 307 and 308, a current interrupting means 310 is provided between the terminal 211 and the external control and monitor circuit 120 and 121. Specifically, as the circuit interrupting means 310, a filter circuit, a switch circuit or a combination thereof is employed.

Figure 5:
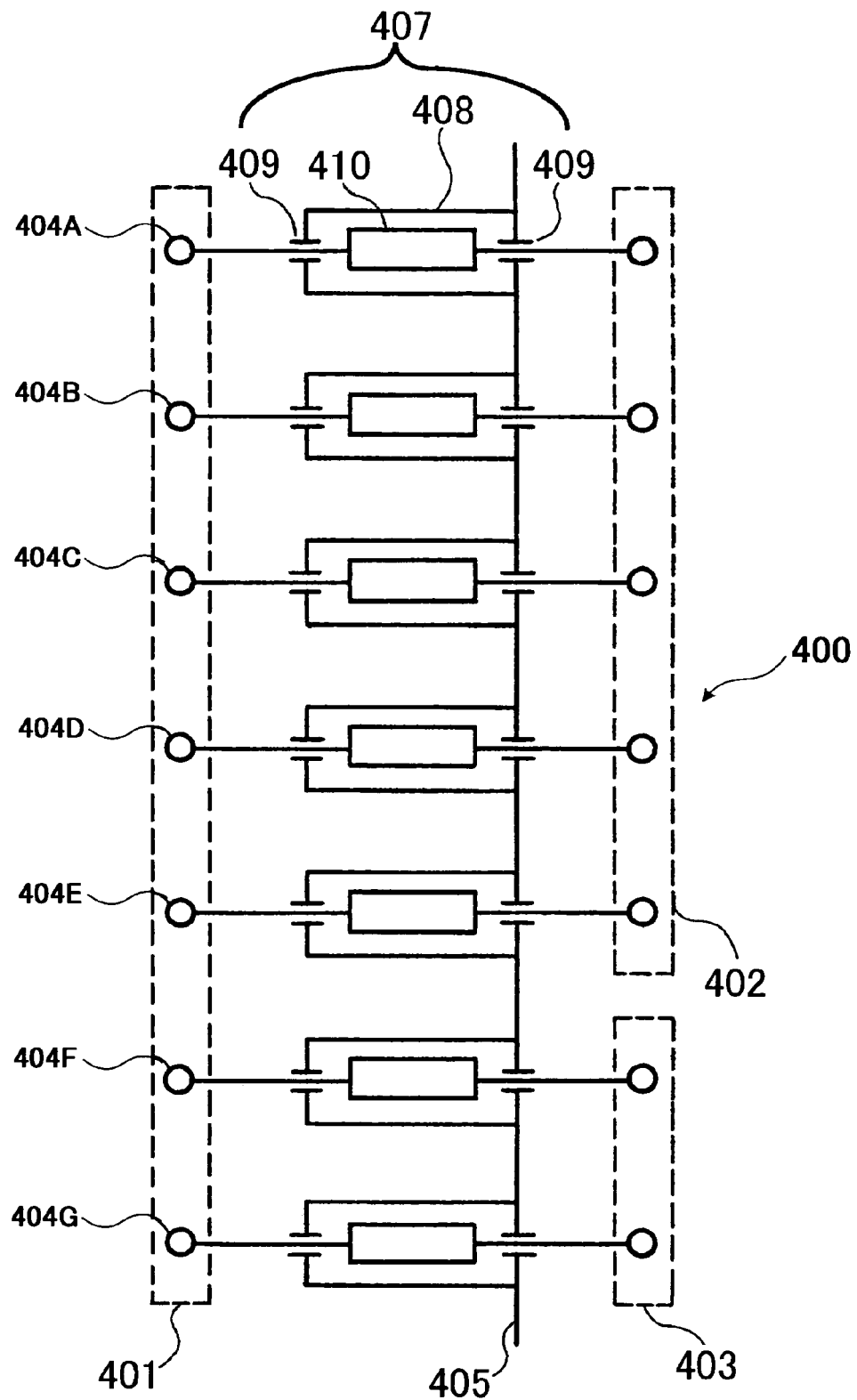
FIG. 5 is a circuit diagram showing a filter circuit employed in FIG. 1 embodiment for preventing the closed loop formation as explained in FIG. 4.

An embodiment of a filter circuit is shown in FIG. 5. The filter circuit 400 is constituted by a current through type filter element 407. As illustrated, the current through type element 407 is a π type filter element in which an inductance element 410 is assembled into an outer casing of a metal cylinder 408 and a through type capacitor 409 is constituted with the input and output terminals, and through the use of the current through type filter element 407, high frequency components such as induction noises are removed from the signal voltage input to the input terminal and only the electrical signals having low frequencies (generally DC current) of the heater element and the sensor elements are transmitted to the output terminal.

The current through type filter 407 is connected via a connector 401 to the respective terminals (211 in FIG. 3) at the side of the cryostats 117 as well as connected via connectors 402 and 403 to the measurement unit 121 and the emergency demagnetizing unit 120. For example, terminals 404A and 404B of the connector 401 are terminals for applying voltage at both terminals of the helium liquid level sensor 210 serving as the sensor element, and terminals 404C, 404D and 404E are terminals to be connected at both terminals and the intermediate point thereof of the liquid level sensor 210 for measuring variation of resistance between the terminals and the intermediate point. Further, terminals 404F and 404G are connected to the heater elements 209 in the upper helium vessel and the lower helium vessel. Further, numeral 405 is a conductor for electrically connecting the outer casing 408 of the filter circuit 400 to the outer casing of the grounded cryostats.

Now, difference of operations when such filter circuit is provided and not provided will be explained with reference to FIGS. 4 and 6. FIG. 4 is a conventional circuit structure diagram in which no filter is provided, and FIG. 6 is a circuit structure diagram in which the filter circuit 400 serving as the circuit interrupting means is provided.

As illustrated in FIG. 4, when no circuit interrupting means is provided, under the condition where such as the liquid helium measurement unit 121 and the emergency demagnetizing unit 120 are connected to the terminal 211, the large loop circuit 501 passing through the ground point 123 of the cryostats 117 and the ground point of such as the liquid helium measurement unit 121 and the emergency demagnetizing unit 120 is formed. Under such condition, when the imaging operation of the MRI apparatus is started, magnetic fluxes of the gradient magnetic field coils and the high frequency magnetic field coils which are pulse driven in association with the imaging operation pass through the loop circuit 501 and an induction voltage of from several volts to ten and several volts is generated therein.

When such pulse like induction voltage is applied to the loop circuit 501, an induced current as indicated by arrows is caused to flow from the control and monitor circuit 120 and 121 via the stray capacitance 307 into a part of the closed loop circuit 300 where the permanent current is flowing. The inductance of the super-conducting coils 204 is extremely high, for example, in the present embodiment, shows 36 H. For this reason, the majority of the pulse like induced current flows through a circuit at the side of the PCS 208 showing zero resistance value to the ground of the cryostats 117. Since this current is pulse like induced noises, the current flows locally through such as the skin of the super-conducting wires of the PCS 208 and sometimes exceeds the critical current inherent to the super-conducting wires. When the current once exceeds the critical current, the PCS 208 transits to a normal conduction state and the permanent current of 400 ampere in the closed loop circuit 300 is consumed by the normal conductivity resistance of the PCS 208 as thermal energy, quenching phenomenon is caused in the super-conducting magnets and the super-conducting state is lost and the magnetic field disappears.

Figure 6:
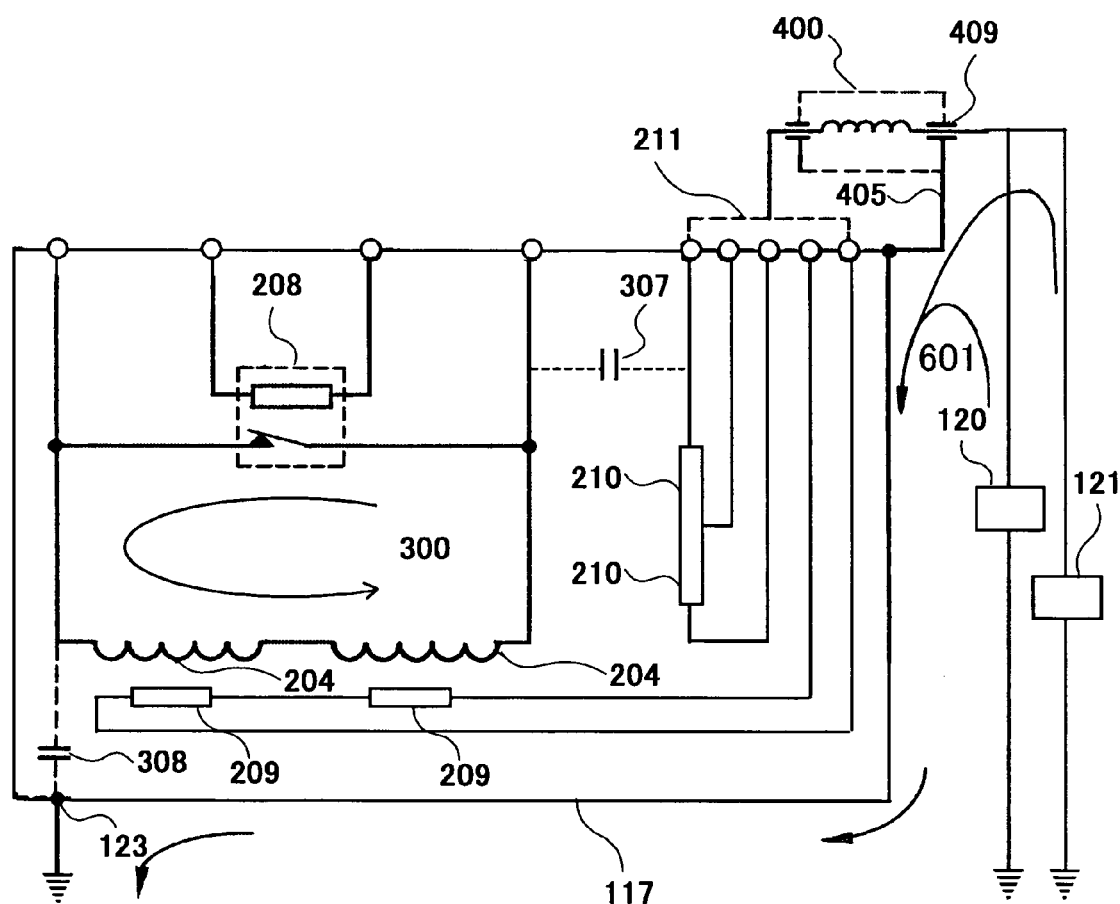
FIG. 6 is a view for explaining a function of the filter circuit as shown in FIG. 5 as a circuit interrupting means.

On the other hand, when the filter circuit 400 is inserted between the terminal 211 and the external control and monitor circuit 120 and 121 as illustrated in FIG. 6, another closed loop (as shown by arrow 601) is constituted with the outer casing of the cryostats 117, the ground point 123, the outer casing 408 of the filter circuit 400, the conductor 405 connected thereto and the connection cables such as for the liquid helium measurement unit 121 and the emergency demagnetizing unit 120. Under this condition, when such as the gradient magnetic field coils and the high frequency magnetic field coils are pulse driven and the magnetic fluxes pass the closed loop circuit 601, an induced voltage of from several volts to ten and several volts is generated therein. Herein, the inside of the cryostats 117 shows no changes and gives the same circuit constant, however, the impedance of the terminal 211 shows extremely high value because of the filter circuit 400. Although the value of the impedance depends on the frequency of the current passing therethrough, since the magnetic flux variation of such as the gradient magnetic field coils and the high frequency magnetic field coils which are pulse driven according to the imaging sequence is more than several hundreds kHz, the value of the impedance shows several MΩ. On the other hand, the impedance value between the input terminal 409 of the filter circuit 400 and the ground shows less than several Ω. As a result, the pulse like induced current flows directly through the outer casing 408 of the filter circuit 400 and the conductor 405 to the casing of the cryostats 117 and never flows in inside the cryostats 117. Namely, by means of the filter circuit 400, the formation of the closed loop circuit (501 in FIG. 4) with the internal circuit of the cryostats 117 and the connection cables for such as the liquid helium measurement unit 121 and the emergency demagnetizing unit 120 can be substantially interrupted.

As has been explained above, through the provision of the filter circuit 400 serving as the circuit interrupting means at the portion of the terminal 211 connecting the internal circuit of the cryostats with the outside, a possible flowing in of the current induced in association with the imaging operation of the MRI apparatus into the internal circuit is prevented and a stable operation of the super-conducting magnets can be ensured.

Figure 7:
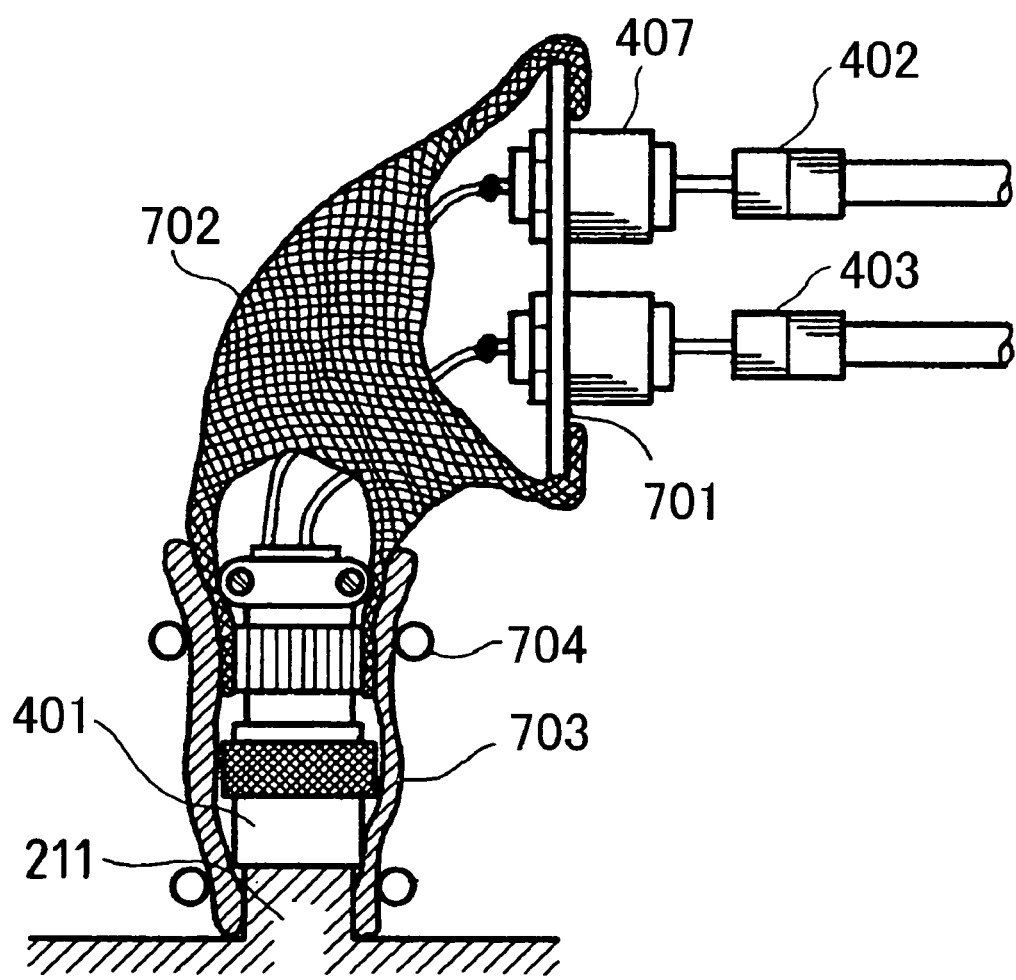
FIG. 7 is an outlook showing a connection structure of the filter circuit as shown in FIG. 5.

A further specific structure of the filter circuit 400 is shown in FIG. 7. In FIG. 7, the corresponding elements as shown in FIG. 5 are designated by the same reference numerals.

In the illustrated structure, the current through type filter elements 407 are firmly secured to a copper plate 701, one sides thereof are connected via lead wires to the connector 401 and the other sides thereof are connected respectively to a connector 402 for the measurement unit 121 and a connector 403 for the emergency demagnetizing unit 120. Further, in the drawing, although only two filter elements 407 are illustrated, same number of filter elements as that of the terminals of the connector 401 as shown in FIG. 5 is actually provided. The connector 401 is constituted by a metal shell and is structured so as to prevent external noise induction in its core wire. Further, the metal shell of the connector 401 and the copper plate 701 for securing the current through type filter elements 407 are electrically connected by a copper net 702. Still further, the outer circumference of the metal shell of the connector 401 and the terminal portion 211 of the cryostats 117 are wound by a shield copper wire 703 and the shield copper wire 703 is firmly secured by reinforcing bands 704. Thereby, the metal shell of the connector 401 is reliably connected to the ground potential of the ground point 123 of the outer casing of the cryostats 117.

Herein above, the embodiment, which employs the filter circuit serving as the circuit interrupting means has been explained. According to the present embodiment, by making use of the difference between the frequency components of the current induced due to such as the gradient magnetic field and the high frequency magnetic field and the frequency components of the control and monitor circuit dealing DC current level for the super-conducting magnets, only the induced current is caused to flow on the metal surface of the cryostats 117 and the influence thereof is substantially eliminated.

Figure 8:
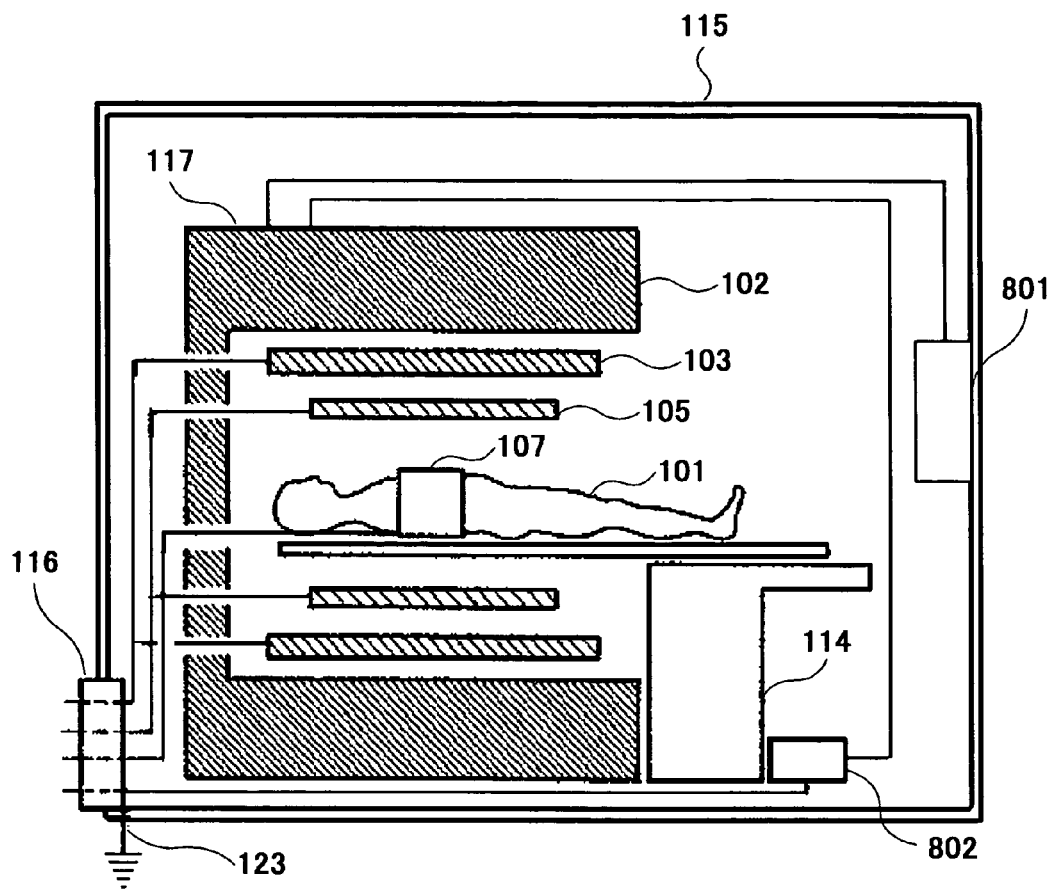
FIG. 8 is a view showing another embodiment of open type MRI apparatus using a super-conducting magnet device according to the present invention.

Now, as another embodiment of MRI apparatus according to the present invention, an MRI apparatus provided with a switch circuit serving as the circuit interrupting means will be explained. FIG. 8 is a diagram showing a schematic outline of the MRI apparatus, and the same constitutional elements as those in FIG. 1 are designated by the same reference numerals. Further, in FIG. 8, illustration of the power sources and the control units disposed outside the shielded examination room 115 is omitted, however, these are the same as those shown in FIG. 1.

Different from the MRI apparatus shown in FIG. 1 embodiment, in the present MRI apparatus, the signal cables for such as an emergency demagnetizing unit 801 and a measurement unit 802 are connected to the internal circuit for the static magnetic field generating magnets 102 without routing such as the filter circuit. Instead thereof, in the emergency demagnetizing unit 801 and the measurement unit 802, a switch circuit of normally OFF are assembled so as to prevent from inducing induction noises in the signal cables in synchronism with the pulse drive of such as the gradient magnetic field coils and the high frequency magnetic field coils.

Figure 9:
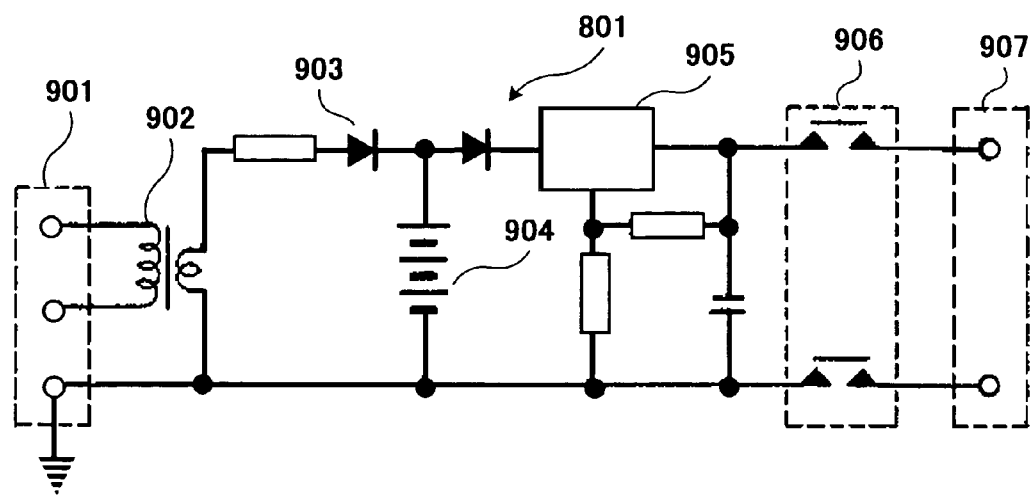
FIG. 9 is a circuit diagram showing an emergency demagnetizing unit including a switch circuit employed in FIG. 8 embodiment.

As shown in FIG. 9, the emergency demagnetizing unit 801 is provided with a transformer 902, which is connected to a commercial power source 901 and transforms the voltage (100~120V) of the commercial power source to a predetermined voltage, diodes 903 for rectification, battery 904, which is connected to the secondary side of the transformer 902 and functions as a power source at the time of power failure, a current drive circuit 905, and a switch circuit 906 provided between the current drive circuit 905 and a connector 907. Power source cables connected to the commercial power source are three phase cables and one of the cables is a ground cable and is connected to a unit ground including the casing of the emergency demagnetizing unit 801 according to the electrical safety standard.

The connector 907 is connected to the terminal 211 for the cryostats 117 and is connected to the emergency demagnetizing use heater element 209 inside the cryostats 117. The switch circuit 906 is operated by pressing an external button not shown and normally interrupts both lines one connected to ground potential and the other being applied of a voltage. Through thus interrupting both lines, the closed loop circuit (501, in FIG. 4) formed via the ground potential can be completely interrupted. In this instance, through covering the switch circuit 906 and the connector 907 with an insulator casing safety can be secured.

In such structure, when an emergency demagnetization is required, an operator presses the external button of the emergency demagnetizing unit 801 and operates the switch circuit 906. Under this condition, the voltage from the commercial power source is rectified by the rectifier circuit of the diodes 903 after being transformed by the transformer 902 and charges the battery 904 as well as input to the current drive circuit 905. The output of the current drive circuit 905 is transferred via the switch circuit 906 to the connector 907 connected to the heater element 209. Thereby, the heater element 209 generates heat, the super-conducting state is broken and the super-conducting coils are rendered to a normal conducting state and rapidly demagnetized.

On the other hand, under a normal state, namely, under an interrupted state of the switch circuit 906, since no closed circuit including the heater element 209 is formed, no closed loop circuit 501 as shown in FIG. 4 is formed between the emergency demagnetizing unit 801 and the internal circuit of the cryostats 117.

Figure 10:
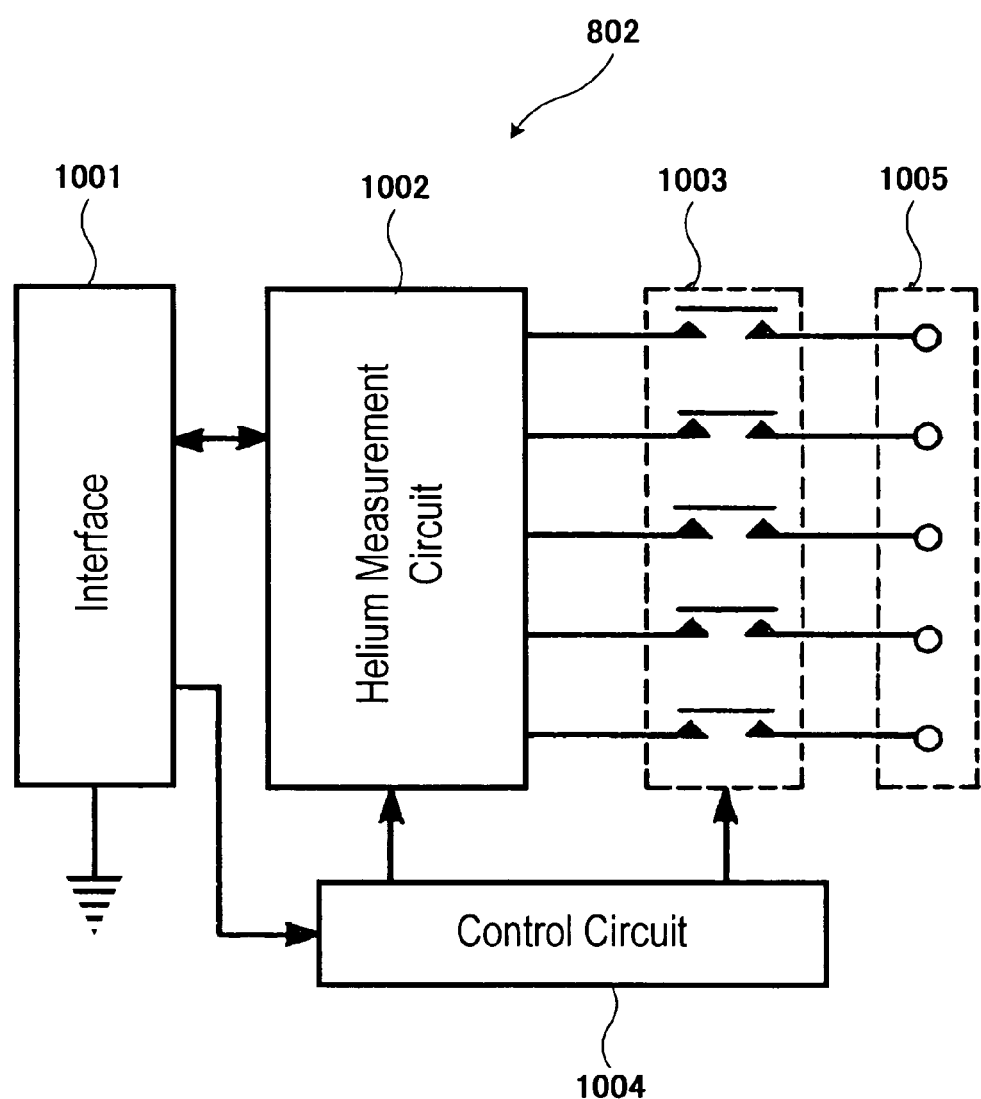
FIG. 10 is a block diagram showing a helium measurement unit including the switch circuit employed in FIG. 8 embodiment.

As shown in FIG. 10, the measurement unit 802 is provided with an interface circuit 1001, which exchanges data signals and control signals with the computer 110 (shown in FIG. 1) of the MRI apparatus, a helium measurement circuit 1002, which applies a predetermined voltage to the liquid level sensor 210 as well as measures resistance value of the liquid level sensor 210 and calculates amount of liquid helium from the measured resistance value, a switch circuit 1003 provided between the helium measurement circuit 1002 and a connector 1005 connected to the liquid level sensor 210 and a control circuit 1004, which controls operation of the helium measurement circuit 1002 and the switch circuit 1003 based on the control signals from the interface circuit 1001. Likely in this embodiment, the switch circuit 1003 uses a normally open switch, which makes and breaks both connecting lines of plus and minus. Further, like the instance of the emergency demagnetizing unit 801, the switch circuit 1003 and the connector 1005 are covered by an insulator casing.

In such constitution, when a command of measuring the amount of helium is input from an input device (for example, console 112) provided in the computer 110 for the MRI apparatus, the signal is input via the interface circuit 1001 to the control circuit 1004, thereby, the switch circuit 1003 is closed as well as the helium measurement circuit 1002 starts its operation. The helium measurement circuit 1002 causes to flow current of, for example, 400 m ampere for about 10 sec. to the liquid level sensor elements 210 and measures the resistance value of the liquid level sensor elements 210 during the current conduction. As has already been explained, the liquid level sensor elements 210 are constituted by a material of which resistance value varies depending on the temperature and through the current flow of 400 m ampere the temperature of the sensor elements 210 themselves rises. However, since no temperature rise occurs of the portion immersed in the liquid helium, the sensor gives a resistance value proportional to the length of the portion above the helium liquid level. Accordingly, through measurement of variation in the resistance value decrease of liquid amount can be determined. The liquid amount measured by the helium measurement circuit 1002 is input in a form of data signals via the interface circuit 1001 to the computer 110 for the MRI apparatus.

Since it is sufficient to perform such measurement of helium amount only once, for example, such as at start-up and periodic inspection, in the instances other than the above, the switch circuit 1003 for the measurement unit 801 is interrupted by the control circuit 1004. Accordingly, like the emergency demagnetizing unit 801, between the measurement unit 802 and the internal circuit of the cryostats 117 no closed loop circuit 501 as shown in FIG. 4 is formed.

In such MRI apparatus of the present embodiment in which the switch circuit serving as the circuit interrupting means is inserted, the opening and closing operation of the switch circuit is effected by making use of the fact that the period when the emergency demagnetizing unit 801 and the measurement unit 802 perform their functions and the period when examination of the subject is performed are different so that no substantial closed loops are formed during the driving of the gradient magnetic field coils and the high frequency magnetic field coils. Accordingly, other than the predetermined periods such as emergency and periodic inspection, the control circuit and the monitor circuit themselves are placed in a condition isolated from the super-conducting magnets 102, therefore, even when such as the gradient magnetic field coils and the high frequency magnetic field coils are driven according to imaging operation of the MRI apparatus, the current induced thereby flows to the ground through the outer casing of the cryostats 117 and no influences are affected to the internal circuit like the MRI apparatus provided with the filter circuit as shown in FIG. 6. On the other hand, when an operation of the emergency demagnetizing unit 801 is required, the switch circuit is placed in connected state and a closed loop is formed with the cryostats 117, the emergency demagnetizing unit 801 and its connection cable, however, since the intended operation of the emergency demagnetizing unit 801 is by nature to attenuate the magnetic field of the super-conducting magnets 102, no problems arise even if a closed loop is formed, induction noises are induced by the driving of the gradient magnetic field coils and the high frequency magnetic field coils and the magnetic field attenuation is caused. Further, since the period when the liquid helium measurement unit 802 is operated is at a period of maintenance and inspection, the gradient magnetic field coils and the high frequency magnetic field coils are not driven. Therefore, even if a closed loop is formed no induction noises are induced therein.

In the above, as embodiments of the present invention, two embodiments one employing the filter circuit for the circuit interrupting means and the other employing the switch circuit therefor have been explained, however, both filter circuit and the switch circuit can be provided in case of an accidental situation. Further, the above embodiments have been explained primarily in connection with the MRI apparatus, the super-conducting magnet device of the present invention can be applied not only for MRI apparatus but also can be generally applied for super-conducting magnet devices provided with super-conducting coils and connection use terminals with external circuits.

According to the present invention, influences to a super-conducting coil circuit due to magnetic flux variation by the gradient magnetic field and the high frequency magnetic field caused in association with the imaging operation of the MRI apparatus are eliminated and a reliable and stable operation of the MRI apparatus is permitted.

Further, according to the present invention, without necessitating application of an element constituted by an inductor and a resistor or a disturbance compensation coil to the connection cables, the noise current, which is transmitted to the super-conducting coils via the stray capacitance, can be reduced. Still further, since no electrical closed loops routing the super-conducting coils are formed, no quenching phenomenon occurs caused by the noises induced by the magnetic flux variation due to the gradient magnetic field and the high frequency magnetic field caused in association with the imaging operation of the MRI apparatus.

The invention claimed is:

1. A magnetic resonance imaging apparatus comprising: a super-conducting magnet including a super-conducting coil circuit having a super-conducting coil and a permanent current switch for controlling a permanent current flowing through the super-conducting coil and a heater element for controlling demagnetization of the super-conducting coil or a sensor element for measuring amount of liquid helium which are accommodated in a helium vessel, a control circuit or a monitor circuit which is electrically connected to the heater element or the sensor element and disposed at the outside of the helium vessel, a gradient magnetic field generating means for generating a gradient magnetic field and providing the same to a static magnetic field generated by the super-conducting magnet, a high frequency magnetic field generating means for generating a high frequency magnetic field to be applied to a subject and a shielded examination room which accommodates the super-conducting magnet. characterized, in that the magnetic resonance imaging apparatus further comprises means for interrupting formation of a closed loop circuit passing through the control circuit or the monitor circuit and the super-conducting coil circuit and being provided inside the shielded examination room between the superconducting magnet and the control circuit or monitor circuit.

2. A magnetic resonance imaging apparatus according to claim 1 characterized, in that the interrupting means is a filter circuit unit.

3. A magnetic resonance imaging apparatus according to claim 2 characterized, in that the filter circuit unit includes an outer casing and a filter element accommodated in the outer casing and a conductor connected to the outer casing forms another closed loop circuit, which bypasses the aforesaid closed ioop circuit, together with the control circuit or the monitor circuit through the helium vessel.

4. A magnetic resonance imaging apparatus according to claim 1 characterized, in that the interrupting means is a switch circuit connected between the heater element and the sensor element and the control circuit or the monitor circuit.

5. A magnetic resonance imaging apparatus according to claim 2 characterized, in that the filter element in the filter circuit unit at least cuts off signals having driving frequencies of the gradient magnetic field generating means and frequency band of the high frequency magnetic field.

6. A magnetic resonance imaging apparatus according to claim 1 characterized, in that the super-conducting magnet is constituted by a pair of super-conducting coils which are disposed so as to sandwich the measurement space where the subject is laid.

7. A magnetic resonance imaging apparatus according to claim 6 characterized, in that the gradient magnetic field generating means and the high frequency magnetic field generating means are respectively constituted by flat plate shaped coils which are respectively disposed so as to sandwich the measurement space where the subject is laid.

8. The magnetic resonance imaging apparatus of claim 1,
wherein said super-conducting magnet further including one or more grounded cryostats, and
wherein the interrupting means includes filter elements secured to a conductive plate and connected between a terminal portion of the grounded cryostats and at least one of said heater element and said sensor element, the conductive plate being electrically coupled to a ground point of an outer casing of the grounded cryostats.

9. The magnetic resonance imaging apparatus of claim 1, wherein the interrupting means includes a filter circuit unit and a switch circuit connected between the heater element or the sensor element on the one hand and the control circuit or the monitor circuit on the other hand.

10. A super-conducting magnet device comprising a super-conducting coil circuit having a super-conducting coil and a permanent current switch for controlling a permanent current flowing through the super-conducting coil and a vessel accommodating the super-conducting coil at a temperature for maintaining the same in super-conducting state characterized, in that the vessel is provided with a terminal portion for connecting a heater element or a sensor element disposed in the vessel to an external circuit and the terminal portion is provided with means for forming a closed loop circuit including the external circuit, an outer wall of the vessel and a grounding point provided at the wall.

11. An open type magnetic resonance imaging apparatus using a super-conducting magnet comprising a super-conducting magnet including a pair of grounded cryostats which are disposed facing in vertical direction so as to sandwich a measurement space where a subject is laid, helium vessels each being accommodated in the respective cryostats and being filled with liquid helium, a super-conducting coil circuit constituted by super-conducting coils each being disposed in the respective helium vessels and a permanent current switch which is disposed in one of the helium vessel and controls conduction of permanent current to be flown through the super-conducting coils and an element for controlling demagnetization of the respective super-conducting coils and another element for measuring amount of the liquid helium filled, a control circuit and a monitor circuit which are disposed outside the cryostats and are respectively connected electrically to the control element and the measurement element, flat plate shaped gradient magnetic field coils which are respectively disposed at facing surface sides of the respective cryostats and generate gradient magnetic field provided for static magnetic field generated by the super-conducting magnet, flat plate shaped high frequency magnetic field coils which are respectively likely disposed at facing surface sides of the respective cryostats and generate high frequency magnetic field to be applied to the subject and a shielded examination room which accommodates the super-conducting magnet, characterized, in that the open type magnetic resonance imaging apparatus using a super-conducting magnet further comprises means for preventing high frequency current induced by the gradient magnetic field coils or the high frequency magnetic field coils from flowing in from the control circuit or the monitor circuit to the super-conducting coil circuit and being provided inside the shielded examination room between the superconducting magnet and the control circuit or monitor circuit.

12. An open type magnetic resonance imaging apparatus using a super-conducting magnet according to claim 11 characterized, in that the means for preventing flowing in of the high frequency current is an electrical circuit for preventing electro-magnetic coupling between the super-conducting coil circuit and the control circuit or the monitor circuit.

13. An open type magnetic resonance imaging apparatus using a super-conducting magnet according to claim 10 characterized, in that the means for preventing flowing in of the high frequency current is a filter circuit for cutting off high frequencies which is provided between the control element or the measurement element and the control circuit or the monitor circuit at the outside of the cryostats.

14. An open type magnetic resonance imaging apparatus using a super-conducting magnet according to claim 11 characterized, in that the means for preventing flowing in of the high frequency current is a normally open switch which is provided between the control element or the measurement element and the control circuit or the monitor circuit at the outside of the cryostats.

15. An open type magnetic resonance imaging apparatus using a super-conducting magnet according to claim 11 characterized, in that the means for preventing flowing in of the high frequency current bypasses the induced high frequency current through an outer wall of the grounded cryostats.

16. A magnetic resonance imaging apparatus comprising: a super-conducting magnet including a super-conducting coil circuit having a super-conducting coil and a permanent current switch for controlling permanent current flowing through the super-conducting coil and a helium vessel for accommodating therein the super-conducting coil circuit and at least one electrical element; at least one electrical circuit which is electrically connected to the electrical element and disposed at the outside of the super-conducting magnet; a gradient magnetic field generating means for generating gradient magnetic field to be superposed over static magnetic field generated by the super-conducting magnet; and a higli frequency magnetic field generating means for generating high frequency magnetic field to be applied to a subject; and a shielded examination room which accommodates the suner-conducting magnet, characterized, in that the magnetic resonance imaging apparatus further comprises mean for interrupting noise current generated based on tomographic image measurement of the subject and of which means is disposed outside the super-conducting magnet and inside the shielded examination room while being inserted between the electrical circuit and the super-conducting magnet.

17. A magnetic resonance imaging apparatus according to claim 16, characterized in that the noise current interrupting means is disposed on an outer wall surface of the super-conducting magnet at a portion where a connecting cable connecting the electrical circuit and the electrical element passes through.

18. A magnetic resonance imaging apparatus according to claim 16, characterized in that the noise current interrupting means is a filter circuit unit connected between the electrical circuit and the electrical element.

19. A magnetic resonance imaging apparatus according to claim 18, characterized in that the filter circuit unit includes an outer casing and a filter element accommodated in the outer casing and with a conductor connected to the outer casing, the electrical circuit and the helium vessel an electrically closed loop circuit is formed which bypasses the super-conducting coil circuit.

20. A magnetic resonance imaging apparatus according to claim 19, characterized in that the filter element passes electrical signals generated by the electrical element and interrupts noises at least of driving frequencies of the gradient magnetic field generating means and of a frequency band of the high frequency magnetic field.

21. A magnetic resonance imaging apparatus according to claim 20, characterized in that the filter element is a current through type filter of $\pi$ type filter in which an inductor element is surrounded by the outer casing of a metal cylinder and a through type capacitor is constituted by input and output terminals thereof.

22. A magnetic resonance imaging apparatus according to claim 16, characterized in that the noise current interrupting means is a switch circuit connected between the electrical element and the electrical circuit.

23. A magnetic resonance imaging apparatus according to claim 22, characterized in that the switch circuit is normally in off state in which all of the electrical connection between the electrical element and the electrical circuit is cut off at the same time and, when desired, is rendered in on state in which the electrical element and the electrical circuit is electrically connected.

24. A magnetic resonance imaging apparatus according to claim 23, characterized in that the switch circuit is rendered in on state at the time when the super-conducting coil is excited and demagnetized.

25. A magnetic resonance imaging apparatus according to claim 16, characterized in that the electrical element is a heater element for controlling the permanent current switch and the electrical circuit is a control circuit for controlling the heater element.

26. A magnetic resonance imaging apparatus according to claim 16, characterized in that the electrical element is a sensor element for measuring amount of liquid helium and the electrical circuit is a monitor circuit for monitoring electrical signals from the sensor element.

27. A magnetic resonance imaging apparatus according to claim 16, characterized in that the noise current interrupting means interrupts formation of an electrically closed loop between the electrical circuit and the super-conducting coil circuit.

28. A magnetic resonance imaging apparatus according to claim 27, characterized in that the noise current interrupting means interrupts formation of an electrically closed loop between the electrical circuit and the super-conducting coil circuit at least at driving frequencies of the gradient magnetic field generating means and at high frequency band of the high frequency magnetic field.

29. A magnetic resonance imaging apparatus according to claim 28, characterized in that the electrically closed loop is formed via a grounded point of the super-conducting magnet and a grounded point of the electrical circuit.

30. A magnetic resonance imaging apparatus according to claim 16, characterized in that the super-conducting coil of the super-conducting magnet is a pair of coils disposed in a facing manner while sandwiching a measurement space where the subject is laid.

31. A magnetic resonance imaging apparatus according to claim 30, characterized in that the gradient magnetic field generating means and the high frequency magnetic field generating means are respectively flat plate shaped coils each of which are respectively disposed at the sides of the measurement space of the super-conducting magnet in a facing manner while sandwiching the measurement space.

32. A magnetic resonance imaging apparatus according to claim 16, characterized in that the super-conducting magnet includes a pair of grounded cryostats which are disposed in vertical direction in a facing manner while sandwiching a measurement space where the subject is laid and are connected each other by a coupling tube, each of the cryostats accommodates therein a helium vessel filled with liquid helium and each of the helium vessels accommodates therein the super-conducting coil circuit, an element of controlling excitation and demagnetization of the respective super-conducting coils and another element for measuring amount of liquid helium filled, at the outside of the super-conducting magnet, a control circuit and a monitor circuit electrically connected respectively to the control element and the measurement element, the gradient magnetic field generating means is gradient magnetic field coils having a flat plate shape which are respectively disposed at the facing sides of the cryostats, the high frequency magnetic field generating means is high frequency magnetic field coils having a flat plate shape which are respectively disposed at the facing sides of the cryostats, and an induction current preventing means for preventing induction current induced by the gradient magnetic field coils or the high frequency magnetic field coils from flowing between the control circuit or the monitor circuit and the super-conducting coil circuit is disposed on an outside portion of the cryostats.

33. A magnetic resonance imaging apparatus according to claim 32 characterized, in that the induction current preventing means is an electrical circuit for preventing electromagnetic coupling between the super-conducting coil circuit and the control circuit or the monitor circuit.

34. A magnetic resonance imaging apparatus according to claim 32, characterized in that the induction current preventing means is a filter circuit which is disposed on an outer wall of the cryostats and is inserted in an electrical connection between the control element or the measurement element and the control circuit or the monitor circuit, and the filter circuit passes electrical signals generated from the control element or the measurement element and interrupts noises at least of driving frequencies of the flat plate shaped gradient magnetic field coils and of frequency band of the high frequency magnetic field.

35. A magnetic resonance imaging apparatus according to claim 32, characterized in that the induction current preventing means is a switch circuit which is disposed on an outer wall of the cryostats and is inserted in an electrical connection between the control element or the measurement element and the control circuit or the monitor circuit, and the switch circuit is normally in off state in which all of the electrical connection between the electrical element and the electrical circuit is cut off at the same time and, when desired, is rendered in on state in which the electrical element and the electrical circuit is electrically connected.

36. A magnetic resonance imaging apparatus according to claim 32, characterized in that the induction current preventing means returns the induction current induced to the control circuit or the monitor circuit via the outer wall of the grounded cryostats.

* * * * *